United States Patent
Plants

(10) Patent No.: US 6,727,726 B1
(45) Date of Patent: Apr. 27, 2004

(54) FIELD PROGRAMMABLE GATE ARRAY ARCHITECTURE INCLUDING A BUFFER MODULE AND A METHOD OF DISTRIBUTING BUFFER MODULES IN A FIELD PROGRAMMABLE GATE ARRAY

(75) Inventor: William C. Plants, Sunnyvale, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 10/293,895

(22) Filed: Nov. 12, 2002

(51) Int. Cl.[7] ............................................. H03K 19/177
(52) U.S. Cl. .............................. 326/41; 326/38; 326/82
(58) Field of Search ............................. 326/37–41, 82, 326/83, 86

(56) References Cited

U.S. PATENT DOCUMENTS

| | | | |
|---|---|---|---|
| 4,255,748 A | 3/1981 | Bartlett | 340/661 |
| 4,625,313 A | 11/1986 | Springer | 371/20 |
| 4,638,187 A | 1/1987 | Boler et al. | 307/451 |
| 4,638,243 A | 1/1987 | Chan | 324/51 |
| 4,684,830 A | 8/1987 | Tsui et al. | 307/465 |
| 4,700,130 A | 10/1987 | Bloemen | 324/110 |
| 4,706,216 A | 11/1987 | Carter | 365/94 |
| 4,713,557 A | 12/1987 | Carter | 307/242 |
| 4,717,912 A | 1/1988 | Harvey et al. | 340/825.83 |
| 4,718,042 A | 1/1988 | Moll et al. | 365/201 |

(List continued on next page.)

FOREIGN PATENT DOCUMENTS

| | | | | |
|---|---|---|---|---|
| EP | 0 415 542 A2 | 3/1991 | | H03K/19/173 |
| EP | 0 415 542 A3 | 10/1991 | | H03K/19/173 |
| EP | 0 889 593 A1 | 1/1999 | | H03K/19/173 |
| EP | 1 137 188 A2 | 9/2001 | | H03L/7/08 |

OTHER PUBLICATIONS

US 6,564,273, 5/2003, Plants (withdrawn)
L. Ashby, "ASIC Cook Distribution using a Phase Locked Loop (PLL)", *Proceedings Fourth Annual IEEE International ASIC Conference and Exhibit*, pp. 6.1–6.3, Sep. 1991.
"AV9170 Clock Synchronizer and Multiplier", pp. 1–4, 8, Nov. 1992.
"AV9170 Application Note", AvaSem, pp. 1–7, Jan. 1993.
U. Ko, "A 30–ps JITTER, 3.6–μs Locking, 3.3–Volt digital PLL for CMOS Gate Arrays", *IEEE 1993 Custom Integrated Circuits Conference*, pp. 23.3.1–23.3.4, Conf. Date: May 9–12, 1993.
A Efendovich et al., "Multi–Frequency Zero–Jitter Delay–Locked Loop", *IEEE 1993 Custom Integrated Circuits Conference*, pp. 27.1.1–27.1.4, Conf. Date: May 9–12, 1993.
R. Quinnell, "Blending gate arrays with dedicated circuits sweetens ASIC development", EDN, pp. 29–32, Mar. 31, 1994.
J. Chen, "PLL–based clock systems span the system spectrum from green PCs to Alpha", EDN, pp. 147–148, 150, 152, 154–155, Nov. 9, 1995.
P. Sevalia, "Straightforward techniques cut jitter in PLL–based clock drivers", EDN, pp. 119–123, 125, Nov. 23, 1995.
D. Bursky, "Memories Hit New Highs And Clocks Run Jitter–Free", Electronic Design, pp. 79–80, 84–85, 89–93, Feb. 19, 1996.

*Primary Examiner*—Don Le
(74) *Attorney, Agent, or Firm*—Sierra Patent Group, Ltd.

(57) ABSTRACT

The present system comprises a device and a method for increasing the performance and utilization in a field programmable gate array (FPGA). The device of the present system comprises an FPGA having logic clusters, wherein each logic cluster further comprises a buffer. The method of the present system comprises a method of determining which buffers situated in each logic cluster are located in the best position in the post-placement user netlist to decrease the capacitance in the user netlist.

12 Claims, 12 Drawing Sheets

U.S. PATENT DOCUMENTS

| | | | | |
|---|---|---|---|---|
| 4,742,252 | A | 5/1988 | Agrawal | 307/465 |
| 4,772,812 | A | 9/1988 | Desmarais | 307/473 |
| 4,800,176 | A | 1/1989 | Kakumu et al. | 437/193 |
| 4,857,774 | A | 8/1989 | El-Ayat et al. | 307/465 |
| 4,870,300 | A | 9/1989 | Nakaya et al. | 307/303 |
| 4,870,302 | A | 9/1989 | Freeman | 307/465 |
| 4,873,459 | A | 10/1989 | El Gamal et al. | 307/465 |
| 4,928,023 | A | 5/1990 | Marshall | 307/443 |
| 4,930,097 | A | 5/1990 | Ledenbach et al. | 364/716 |
| 4,935,645 | A | 6/1990 | Lee | 307/362 |
| 4,959,561 | A | 9/1990 | McDermott et al. | 307/443 |
| 4,978,905 | A | 12/1990 | Hoff et al. | 323/314 |
| 5,008,855 | A | 4/1991 | Eltoukhy et al. | 365/96 |
| 5,017,813 | A | 5/1991 | Galbraith et al. | 307/465 |
| 5,046,035 | A | 9/1991 | Jigour et al. | 364/716 |
| 5,083,083 | A | 1/1992 | El-Ayat et al. | 324/158 R |
| 5,121,394 | A | 6/1992 | Russell | 371/22.1 |
| 5,122,685 | A | 6/1992 | Chan et al. | 307/465.1 |
| 5,126,282 | A | 6/1992 | Chiang et al. | 437/172 |
| 5,132,571 | A | 7/1992 | McCollum et al. | 307/465.1 |
| 5,144,166 | A | 9/1992 | Camarota et al. | 307/465.1 |
| 5,187,392 | A | 2/1993 | Allen | 307/465 |
| 5,198,705 | A | 3/1993 | Galbraith et al. | 307/465 |
| 5,208,491 | A | 5/1993 | Ebeling et al. | 307/465 |
| 5,220,213 | A | 6/1993 | Chan et al. | 307/465 |
| 5,220,215 | A | 6/1993 | Douglas et al. | 307/465 |
| 5,221,865 | A | 6/1993 | Phillips et al. | 307/465 |
| 5,222,066 | A | 6/1993 | Grula et al. | 371/21.1 |
| 5,258,319 | A | 11/1993 | Inuishi et al. | 437/35 |
| 5,272,388 | A | 12/1993 | Bakker | 307/202.1 |
| 5,286,922 | A | 2/1994 | Curtiss | 174/112 |
| 5,293,133 | A | 3/1994 | Birkner et al. | 324/713 |
| 5,300,830 | A | 4/1994 | Hawes | 307/465 |
| 5,300,832 | A | 4/1994 | Rogers | 307/475 |
| 5,317,698 | A | 5/1994 | Chan | 395/325 |
| 5,365,485 | A | 11/1994 | Ward et al. | 365/221 |
| 5,367,207 | A | 11/1994 | Goetting et al. | 307/465 |
| 5,375,089 | A | 12/1994 | Lo | 365/189.04 |
| 5,394,033 | A | 2/1995 | Tsui et al. | 326/41 |
| 5,394,034 | A | 2/1995 | Becker et al. | 326/39 |
| 5,396,128 | A | 3/1995 | Dunning et al. | 326/68 |
| 5,397,939 | A | 3/1995 | Gordon et al. | 326/38 |
| 5,399,920 | A | 3/1995 | Van Tran | 326/83 |
| 5,400,262 | A | 3/1995 | Mohsen | 364/489 |
| 5,430,335 | A | 7/1995 | Tanoi | 327/170 |
| 5,430,687 | A | 7/1995 | Hung et al. | 365/230.08 |
| 5,469,003 | A | 11/1995 | Kean | 326/39 |
| 5,469,396 | A | 11/1995 | Eltoukhy | 365/210 |
| 5,473,268 | A | 12/1995 | Declercq et al. | 326/80 |
| 5,485,103 | A | 1/1996 | Pedersen et al. | 326/41 |
| 5,486,775 | A | 1/1996 | Veenstra | 126/38 |
| 5,526,312 | A | 6/1996 | Eltoukhy | 365/201 |
| 5,537,057 | A | 7/1996 | Leong et al. | 326/41 |
| 5,546,019 | A | 8/1996 | Liao | 326/81 |
| 5,559,464 | A | 9/1996 | Orii et al. | 327/333 |
| 5,572,476 | A | 11/1996 | Eltoukhy | 365/210 |
| 5,666,322 | A | 9/1997 | Conkle | 365/233 |
| 5,670,905 | A | 9/1997 | Keeth et al. | 327/333 |
| 5,744,979 | A | 4/1998 | Goetting | 326/39 |
| 5,744,980 | A | 4/1998 | McGowan et al. | 326/40 |
| 5,801,547 | A | 9/1998 | Kean | 326/40 |
| 5,809,281 | A | 9/1998 | Steele et al. | 395/497.01 |
| 5,815,003 | A | 9/1998 | Pedersen | 326/39 |
| 5,815,004 | A | 9/1998 | Trimberger et al. | 326/41 |
| 5,821,776 | A | 10/1998 | McGowan | 326/41 |
| 5,825,200 | A | 10/1998 | Kolze | 326/38 |
| 5,825,201 | A | 10/1998 | Kolze | 326/39 |
| 5,825,202 | A | 10/1998 | Tavana et al. | 326/39 |
| 5,825,662 | A | 10/1998 | Trimberger | 364/491 |
| 5,828,230 | A | 10/1998 | Young | 326/41 |
| 5,828,538 | A | 10/1998 | Apland et al. | 361/56 |
| 5,831,448 | A | 11/1998 | Kean | 326/41 |
| 5,832,892 | A | 11/1998 | Yaoita | 123/260 |
| 5,835,165 | A | 11/1998 | Keate et al. | 348/845.1 |
| 5,835,998 | A | 11/1998 | Pedersen | 326/40 |
| 5,838,167 | A | 11/1998 | Erickson et al. | 326/38 |
| 5,838,584 | A | 11/1998 | Kazarian | 364/491 |
| 5,838,954 | A | 11/1998 | Trimberger | 395/500 |
| 5,847,441 | A | 12/1998 | Cutter et al. | 257/530 |
| 5,847,577 | A | 12/1998 | Trimberger | 326/38 |
| 5,848,005 | A | 12/1998 | Cliff et al. | 365/230.03 |
| 5,848,006 | A | 12/1998 | Nagata | 365/230.06 |
| 5,850,151 | A | 12/1998 | Cliff et al. | 326/39 |
| 5,850,152 | A | 12/1998 | Cliff et al. | 326/40 |
| 5,850,564 | A | 12/1998 | Ting et al. | 395/800.37 |
| 5,852,608 | A | 12/1998 | Csoppenszky et al. | 370/465 |
| 5,854,763 | A | 12/1998 | Gillingham et al. | 365/189.04 |
| 5,859,542 | A | 1/1999 | Pedersen | 326/39 |
| 5,859,543 | A | 1/1999 | Kolze | 326/41 |
| 5,859,544 | A | 1/1999 | Norman | 326/40 |
| 5,861,761 | A | 1/1999 | Kean | 326/41 |
| 5,869,981 | A | 2/1999 | Agrawal et al. | 326/39 |
| 5,870,586 | A | 2/1999 | Baxter | 395/500 |
| 5,880,492 | A | 3/1999 | Duong et al. | 257/209 |
| 5,880,512 | A | 3/1999 | Gordon et al. | 257/530 |
| 5,880,597 | A | 3/1999 | Lee | 326/41 |
| 5,880,598 | A | 3/1999 | Duong | 326/41 |
| 5,883,526 | A | 3/1999 | Reddy et al. | 326/41 |
| 5,883,850 | A | 3/1999 | Lee et al. | 365/230.03 |
| 5,936,426 | A | 8/1999 | Wilson et al. | 326/49 |
| 5,949,719 | A | 9/1999 | Clinton et al. | 365/189.01 |
| 5,952,847 | A | 9/1999 | Plants et al. | 326/80 |
| 5,994,934 | A | 11/1999 | Yoshimura et al. | 327/158 |
| 6,011,744 | A | 1/2000 | Sample et al. | 365/230.03 |
| 6,034,677 | A | 3/2000 | Noguchi et al. | 345/327 |
| 6,038,627 | A | 3/2000 | Plants | 710/126 |
| 6,049,487 | A | 4/2000 | Plants et al. | 365/189.04 |
| 6,111,448 | A | 8/2000 | Shibayama | 327/293 |
| 6,181,174 | B1 | 1/2001 | Fujieda et al. | 327/158 |
| 6,289,068 | B1 | 9/2001 | Hassoun et al. | 375/376 |
| 6,292,016 | B1 | 9/2001 | Jefferson et al. | 326/39 |
| 6,329,839 | B1 | 12/2001 | Pani et al. | 326/41 |
| 6,430,088 | B1 | 8/2002 | Plants et al. | 365/189.04 |
| 6,437,650 | B1 | 8/2002 | Sung et al. | 331/25 |
| 6,496,887 | B1 | 12/2002 | Plants | 710/100 |

FIELD PROGRAMMABLE GATE ARRAY ARCHITECTURE INCLUDING A BUFFER MODULE AND A METHOD OF DISTRIBUTING BUFFER MODULES IN A FIELD PROGRAMMABLE GATE ARRAY

BACKGROUND OF THE SYSTEM

1. Field of the System

The present system relates to field programmable gate array (FPGA) devices. More specifically, the system relates to a buffer module to increase the performance and utilization of an FPGA and a method of distributing buffer modules within an FPGA.

2. Background

FPGAs are known in the art. An FPGA comprises any number of logic modules, an interconnect routing architecture and programmable elements that may be programmed to selectively interconnect the logic modules to one another and to define the functions of the logic modules. An FPGA is an array of uncommitted gates with uncommitted wiring channels. To implement a particular circuit function, the circuit is mapped into the array and the appropriate programmable elements are programmed to implement the necessary wiring connections that form the user circuit.

A field programmable gate array circuit can be programmed to implement virtually any set of digital functions. Input signals are processed by the programmed circuit to produce the desired set of outputs. Such inputs flow from the user's system, through input buffers and through the circuit, and finally back out the user's system via output buffers. Such buffers provide any or all of the following input/output (I/O) functions: voltage gain, current gain, level translation, delay, signal isolation or hystersis.

An FPGA core tile may be employed as a stand-alone FPGA, repeated in a rectangular array of core tiles, or included with other functions in a system-on-a-chip (SOC). The core FPGA tile may include an array of logic modules. An FPGA core tile may also include other components such as static random access memory (SRAM) modules. Horizontal and vertical routing channels provide interconnections between the various components within an FPGA core tile. Programmable connections are provided by programmable elements between the routing resources.

The programmable elements in an FPGA can be either one-time programmable or re-programmable. Re-programmable elements used in FPGA technologies include SRAM, EPROM, flash and other cell-controlled pass transistors or other re-programmable elements as is well known to those of ordinary skill in the art. One-time programmable elements used in FPGA technologies may comprise antifuse devices.

Antifuse devices are well known in the integrated circuit art. Antifuse devices comprise a pair of conductive electrodes separated by one or more layers of dielectric material. During programming, antifuses exhibit very high resistance between the two electrodes and may be considered to be small capacitors. For antifuses that are to be programmed, a programming process ruptures the dielectric material and creates a low-impedance connection between the two conductive electrodes.

In antifuse FPGAs, long tracks are problematic for both programming and normal operation. When programming, if there are too many antifuses on a track, the small amount of leakage current per antifuse can add up and cause the track not to remain at the proper voltage level when precharged or driven.

During normal operation, long routing tacks are problematic due to their large parasitic capacitances and resistances. This is exacerbated because unprogrammed antifuses act as small capacitors. The longer the routing track, the more antifuses the track will have.

Another issue when programming and operating an antifuse FPGA is high "fanout" nets. This is a two-dimensional version of the long routing track problem. In a core tile, there are many logic modules, one of which may be a source module. The source module originates a signal that has to travel to any number of destination modules. The number of destination modules is known as the "fanout." The paths between the source module and the destination modules is referred to as the net.

FIG. 1 is a simplified drawing showing the connectivity between a source module 2 and several destination modules 4 in an FPGA core tile. Source module 2 is located on a row adjacent to horizontal track 6. A row adjacent to single vertical track 8 is coupled to the output of source module 2 by means of an antifuse (not shown). Vertical track 8 is also coupled to a horizontal track in every channel by means of additional antifuses (not shown). This causes great capacitive loading and substantial series resistance resulting in a very slow propagation delay.

In prior-art FPGAs, the solution to the problem was buffering. In synthesis-based designs, if the auto-buffering tool was enabled, the design software would automatically insert buffers into the user netlist to comply with the maximum fanout rules and any timing data provided. In schematic-based designs, the user would have to enter the buffers into the schematics manually or let place-and-route software enter the buffers into the netlist for the user. The effect of adding the buffers in either the synthesis based designs or the schematic based designs is to break one long, complicated net driven by one driver, such as the one illustrated in FIG. 1, into multiple nets driven by multiple drivers.

However, there are problems with the approach set forth above. First, The logic modules in the FPGA core tile are used to buffer signals. Thus, the logic modules that are used to buffer signals are consequently unavailable to perform logic operations. In prior art antifuse FPGAs, approximately 12% of the logic modules are used as simple buffers. In some of the larger antifuse FPGAs the percentage of logic modules used as simple buffer modules could be as high as 25% or more. Also, logic modules are much more complicated and thus slower than simple buffers by a factor of approximately three. This significantly hinders performance when logic modules are used as buffers.

Hence there is a need for an FPGA buffering scheme that allows more of the logic modules in the FPGA to be used for logic functions rather than buffering, while maintaining a net size low enough to reduce the negative effects of long tracks.

SUMMARY OF THE SYSTEM

The present system comprises a device and a method for increasing the performance and flexibility in a field programmable gate array. The device comprises a field programmable gate array having a plurality of interconnect conductors, a plurality of programmable elements, a plurality of input/output modules, and a plurality of logic clusters. The logic clusters each have a plurality of logic modules, at least one flip-flop, at least one buffer. Other modules, such as long distance transmitter and receiver modules may also be present.

The method of the present system comprises implementing buffers into an FPGA device comprised of a plurality of logic clusters. Each of said logic clusters has a buffer module. The method further comprises inputting a function netlist defining and optimizing a user circuit, which may or may not have gone through a round of auto buffering. Next, the cells comprising the user input are placed into the FPGA logic clusters. The function netlist is then analyzed to determine the placement of the buffer modules. At least one of the buffers is then selected for a post-placement function netlist. Next, at least one of the buffers is placed in the post-placement netlist. Next, a routing structure to interconnect the logic clusters to implement the user circuit is defined and a programming data file is generated. Finally, the programmable elements of one or more FPGA devices are programmed using the programming data.

DETAILED DESCRIPTION

Those of ordinary skill in the art will realize that the following description of the present invention is illustrative only and not in any way limiting. Other embodiments of the invention will readily suggest themselves to such skilled persons.

This disclosure may relate to data communications. Various disclosed aspects may be embodied in various computer and machine-readable data structures. Furthermore, it is contemplated that data structures embodying the teachings of the disclosure may be transmitted across computer and machine-readable media, and through communications systems by use of standard protocols such as those used to enable the Internet and other computer networking standards.

The disclosure may relate to machine-readable media on which are stored various aspects of the disclosure. It is contemplated that any media suitable for retrieving instructions is within the scope of the present disclosure. By way of example, such media may take the form of magnetic, optical, or semiconductor media, and may be configured to be accessible by a machine as is known in the art.

Various aspects of the disclosure may be described through the use of flowcharts. Often, a single instance of an aspect of the present disclosure may be shown. As is appreciated by those of ordinary skill in the art, however, the protocols, processes, and procedures described herein may be repeated continuously or as often as necessary to satisfy the needs described herein. Accordingly, the representation of various aspects of the present disclosure through the use of flowcharts should not be used to limit the scope of the present disclosure.

Figure 2A:
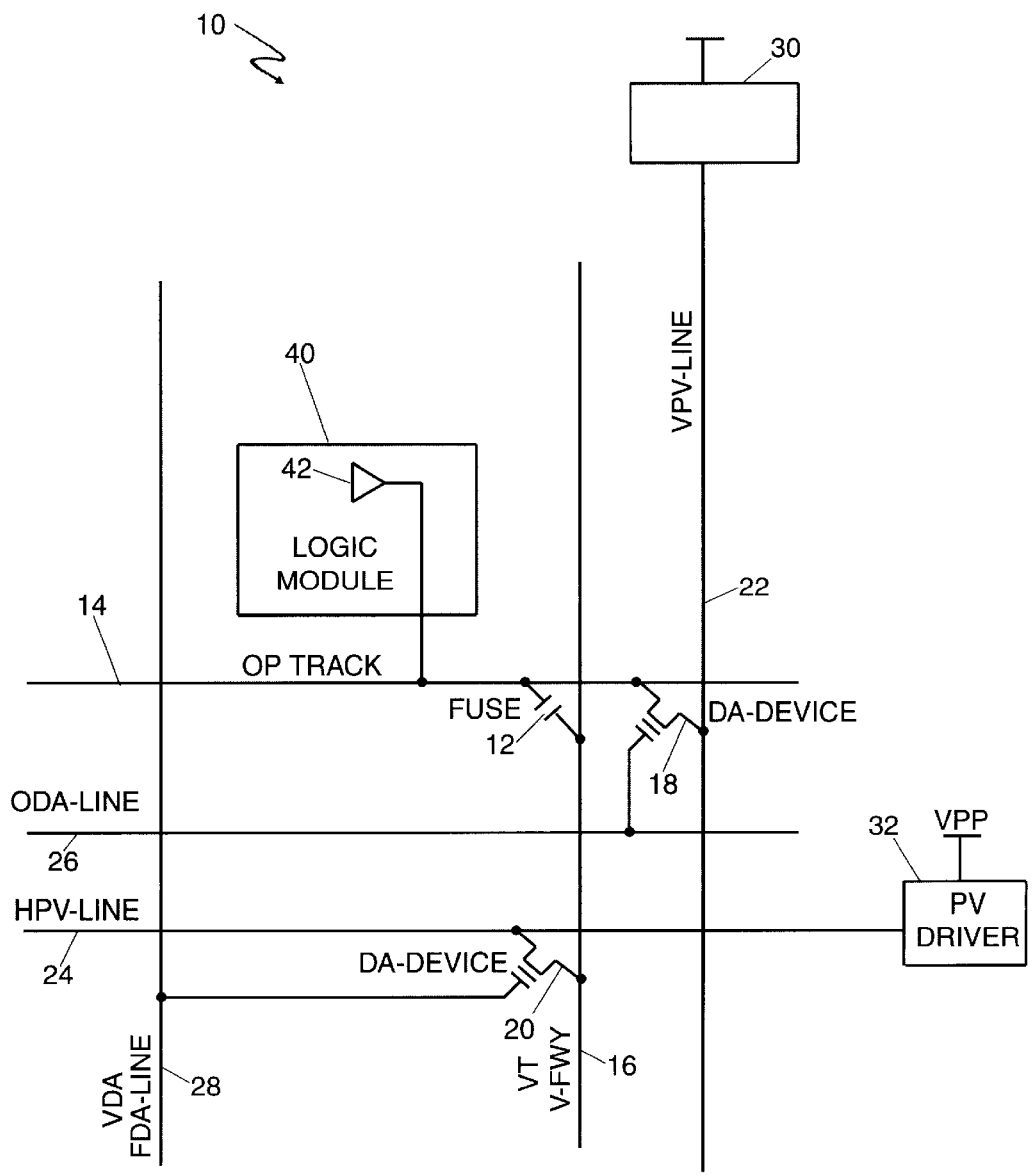
FIG. 2a is a schematic diagram of an antifuse programming circuit before programming.

FIG. 2a is a schematic diagram illustrating antifuse circuit 10 prior to programming in an antifuse FPGA. Logic module 40 having an output buffer 42 is coupled to horizontal routing track 14. Logic module 40 and load-capacitance-management buffer 42 will be discussed in greater detail below.

Antifuse 12, to be programmed, is coupled between horizontal routing track 14 and vertical routing track 16. Horizontal routing track 14 and vertical routing track 16 are used to route signals in the FPGA after programming. Each routing track has a direct-address transistor associated with it having a source/drain terminal coupled to the routing track. For example, in circuit 10, direct address transistor 18 has one source/drain coupled to horizontal track 14 and its other source/drain coupled to programming voltage line 22 which generally runs perpendicular to horizontal routing track 14. Programming voltage line 22 can be coupled to Vpp through programming voltage driver 30. Vpp is an external power supply for the programming voltage circuits. Direct-address transistor 18 has its gate coupled to horizontal direct-address line 26 which runs perpendicular to programming voltage line 22. Direct-address transistor 20 has its source/drain coupled to vertical routing track 16 and its other source/drain coupled to programming voltage line 24 which generally runs perpendicular to vertical routing track 16. Programming voltage line 24 can be coupled to Vpp through programming voltage driver 32. Direct-address transistor 20 has its gate coupled to vertical direct-address line 28 which runs perpendicular to programming voltage line 24.

During programming, the horizontal direct address lines, vertical direct address lines, horizontal programming voltage lines and vertical programming voltage lines form a two level decoding scheme that uniquely addresses each antifuse. All of the horizontal programming voltage and vertical programming voltage lines are charged to Vpp/2 for programming. Next, the two relevant direct address lines are driven to a super voltage ($V_{SV}$) to allow propagation of Vpp to the antifuse. Super voltage ($V_{SV}$) is an external power supply which is sufficiently higher than $V_{PP}$ t allow the programming voltage to flow to the fuse. Next, one of the two relevant (horizontal programming voltage or vertical programming voltage) lines is driven to Vpp and the other is driven to ground by the respective programming voltage drivers. This ruptures the antifuse dielectric and programs the antifuse. Which of the programming voltage lines is driven to Vpp or ground depends on the structure and programming circuitry of the antifuse and is beyond the scope of this disclosure.

Figure 2B:
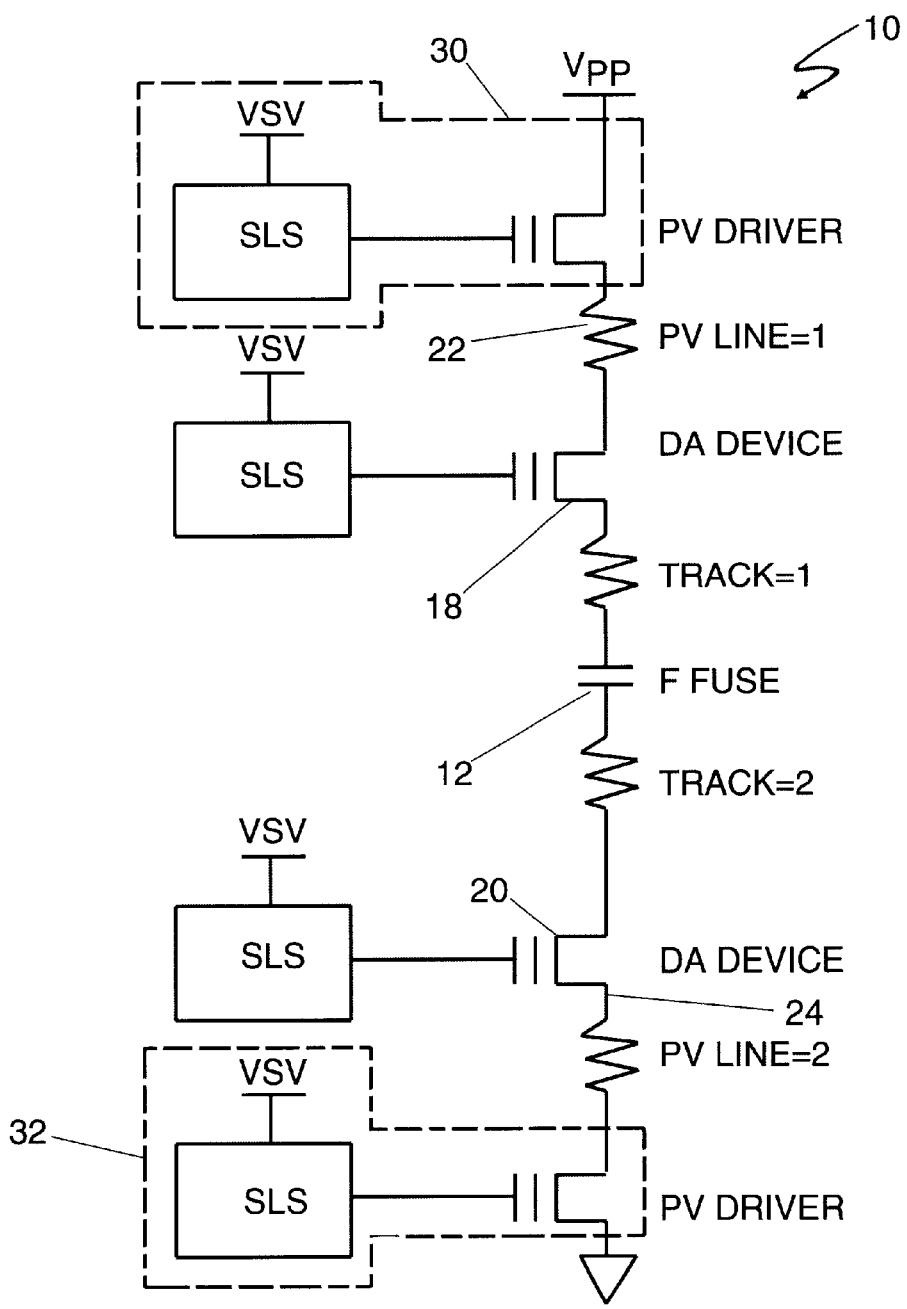
FIG. 2b is a simplified schematic diagram of an antifuse circuit-programming path prior to programming.

FIG. 2b is a simplified schematic illustrating the programming path of antifuse 12 prior to programming. Antifuse 12 is the fuse being programmed. As illustrated, programming voltage driver 30 supplies Vpp to the source/drain of direct address device 18. Super voltage, $V_{SV}$, will be applied to the gate of direct address device 18 during programming. Programming voltage driver 32 is driven to ground pulling the source/drain of direct address device 20 to ground. Thus, circuit 10 supplies Vpp to the track 14 side of antifuse 12 and ground to the track 16 side of antifuse 12 until the dielectric ruptures and an electrical connection is formed.

Figure 2C:
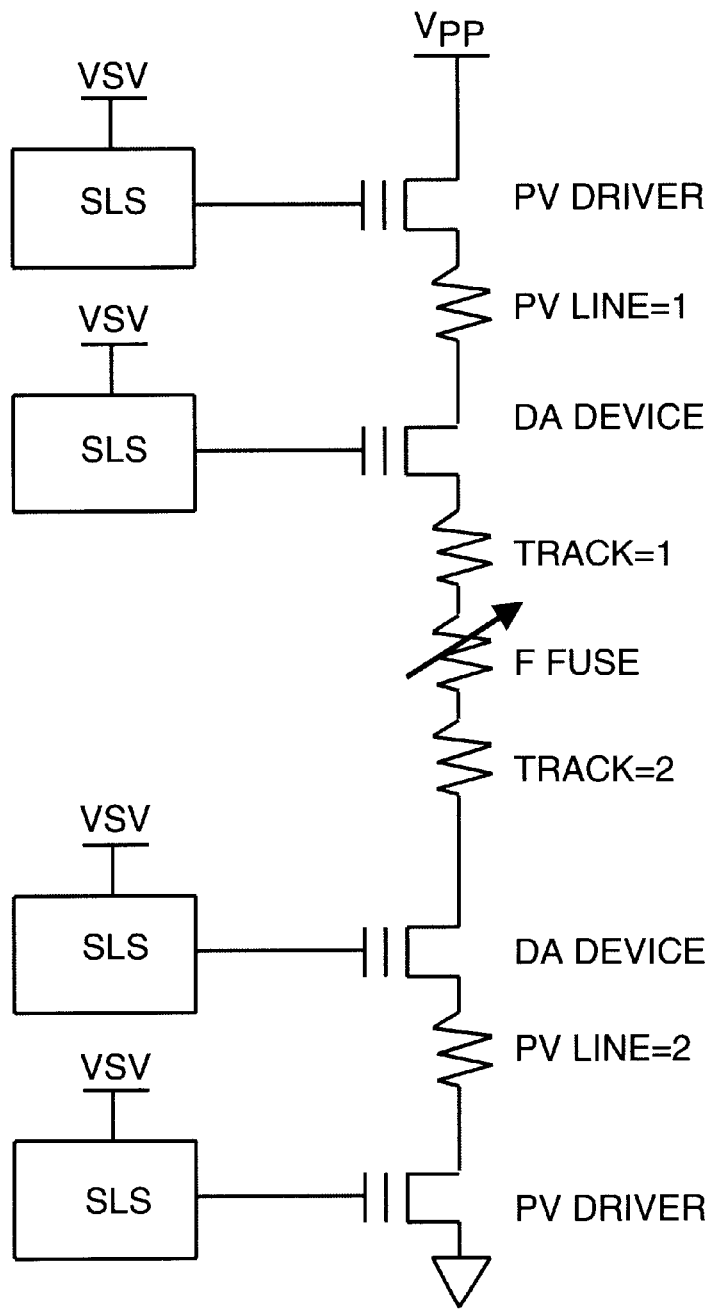
FIG. 2c is a simplified schematic diagram of an antifuse circuit-programming path during programming and soaking.

FIG. 2c is a simplified schematic illustrating circuit 10 after the programming of antifuse 12. As current flows through antifuse 12, the effective resistance drops, the current through the fuse increases and the voltage across the fuse drops. This is called "soaking" the fuse. Eventually, the current settles into an equilibrium value known as $I_{soak}$. In actual practice, Vpp and ground can be reversed (called a "reverse soak").

Because currents are repeatedly applied through an antifuse during normal operation, the programming process could reverse and the antifuse could become unprogrammed. In general, if the maximum current ($I_{peak}$) allowed to flow through an antifuse during normal operation is limited to 50% of $I_{soak}$ then the antifuse will operate reliably for the life of the FPGA.

The load-capacitance-management buffer of the present system is provided as a buffer dedicated to addressing the capacitance problems associated with long lines and large fan out nets. As will be illustrated in greater detail below, load-capacitance-management buffers are included in every logic cluster, and thus available to be programmed into the circuit when ever there is a need to drive a load or to break a very long line into smaller, more manageable increments.

Figure 3:
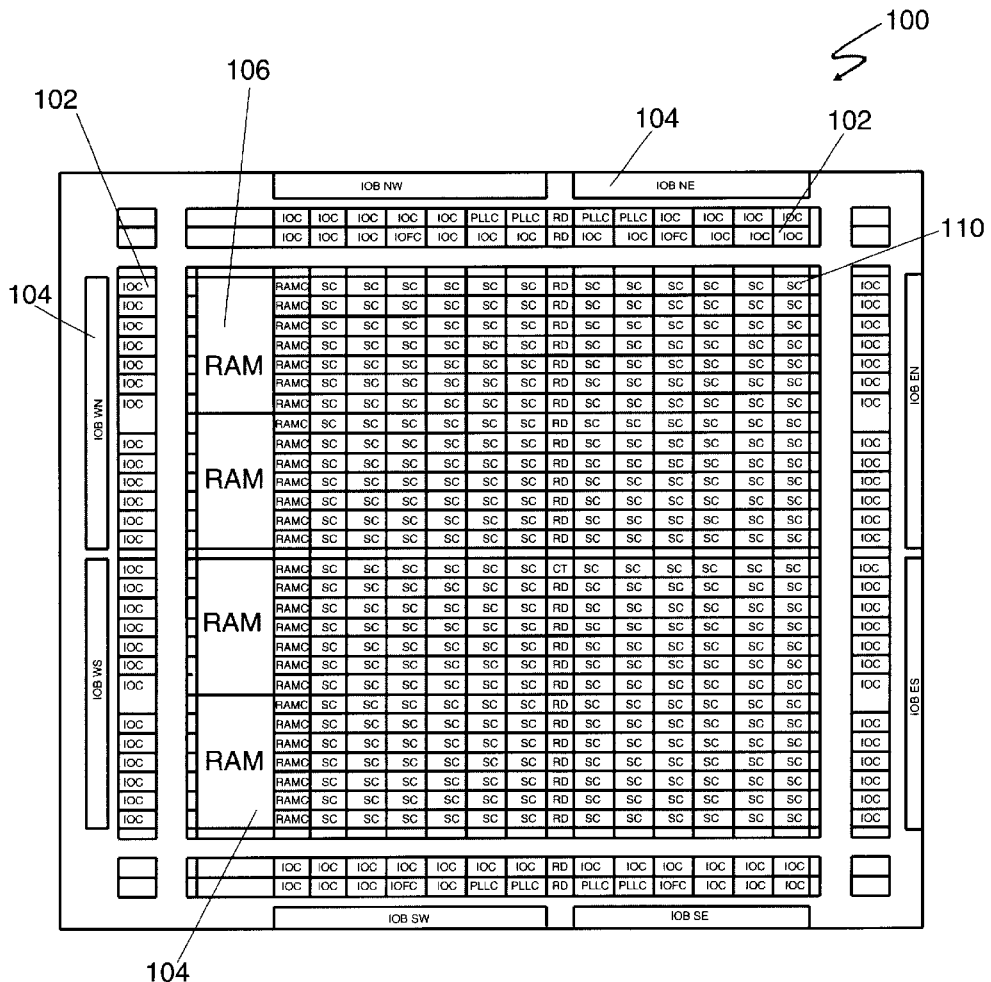
FIG. 3 is a block diagram of a one-tile antifuse FPGA of the present system.
Figure 4:
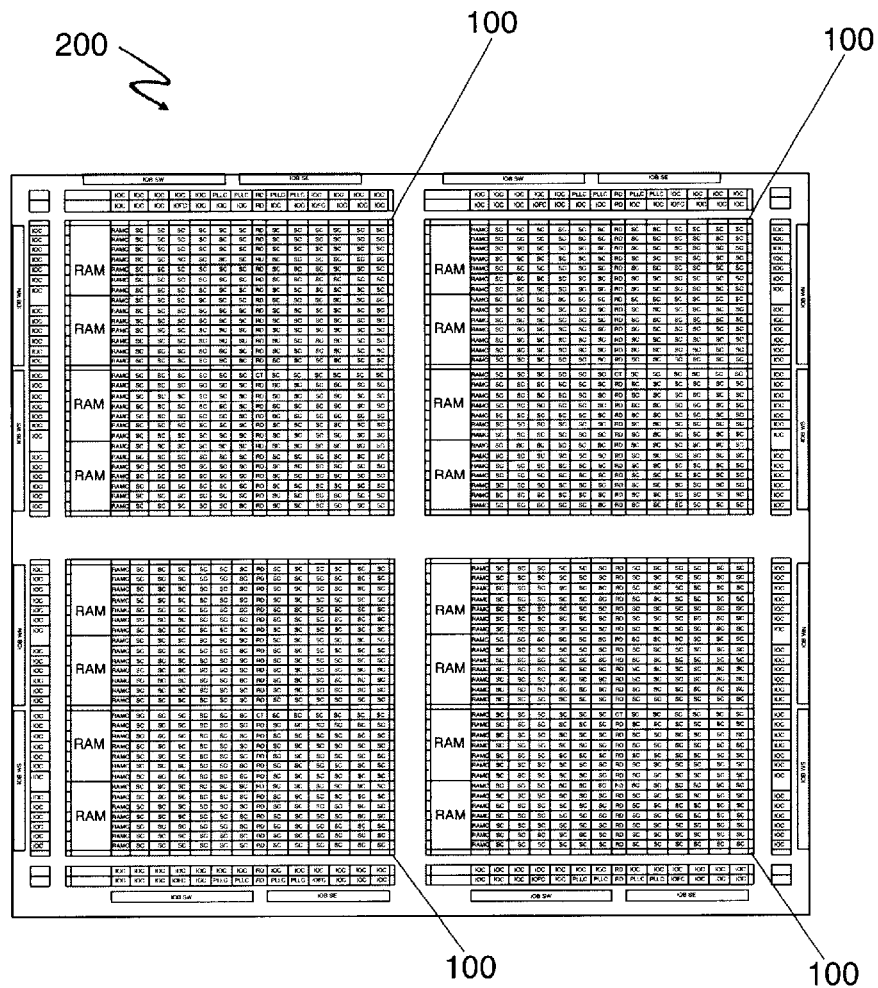
FIG. 4 is a block diagram of an antifuse FPGA of the present system including multiple core tiles.

FIG. 3 is a block diagram of a core tile in an antifuse FPGA 100 of the present system. Antifuse FPGA core tile comprises an array of logic clusters 110 and an array of random access memory modules 106. Input/output clusters 102 and input/output banks 104 surround the FPGA core tile. Logic clusters 110 are connected together by a routing interconnect architecture (not shown) that may comprise multiple levels of routing interconnects. FIG. 4 is a block diagram of an antifuse FPGA including multiple core tiles of the type shown in FIG. 3. As shown in FIG. 4, antifuse FPGA 200 comprises four core tiles 100, though other numbers of tiles are possible.

Figure 5:
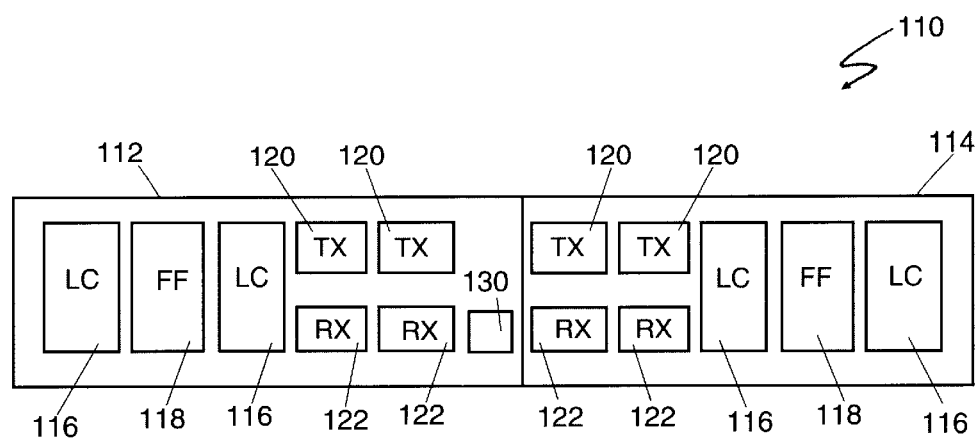
FIG. 5 is a simplified block diagram of a logic cluster of the present system.

FIG. 5 is a simplified block diagram of a logic cluster 110 of the present system. As would be clear to those of ordinary skill in art having the benefit of this disclosure, logic cluster 110 may comprise any number of the logic components indicated below. The example set forth below is for illustrative purposes only and in no way limits the scope of the present invention. Logic cluster 110 comprises two sub-clusters 112 and 114. Sub-clusters 112 and 114 each contain two logic modules 116, a flip-flop 118, two receiver modules 122 and two transmitter modules 120. Sub-cluster 112 contains a buffer module 130. In FPGAs designed in accordance with an embodiment of the present invention, there is one buffer module 130 for every N logic modules 116. In this example, for illustrative purposes only, N=4. Having one buffer for every four logic modules can increase the logic capability of the FPGA core tile by 25% and is the equivalent of being able to auto buffer at a 25% rate.

Figure 6:
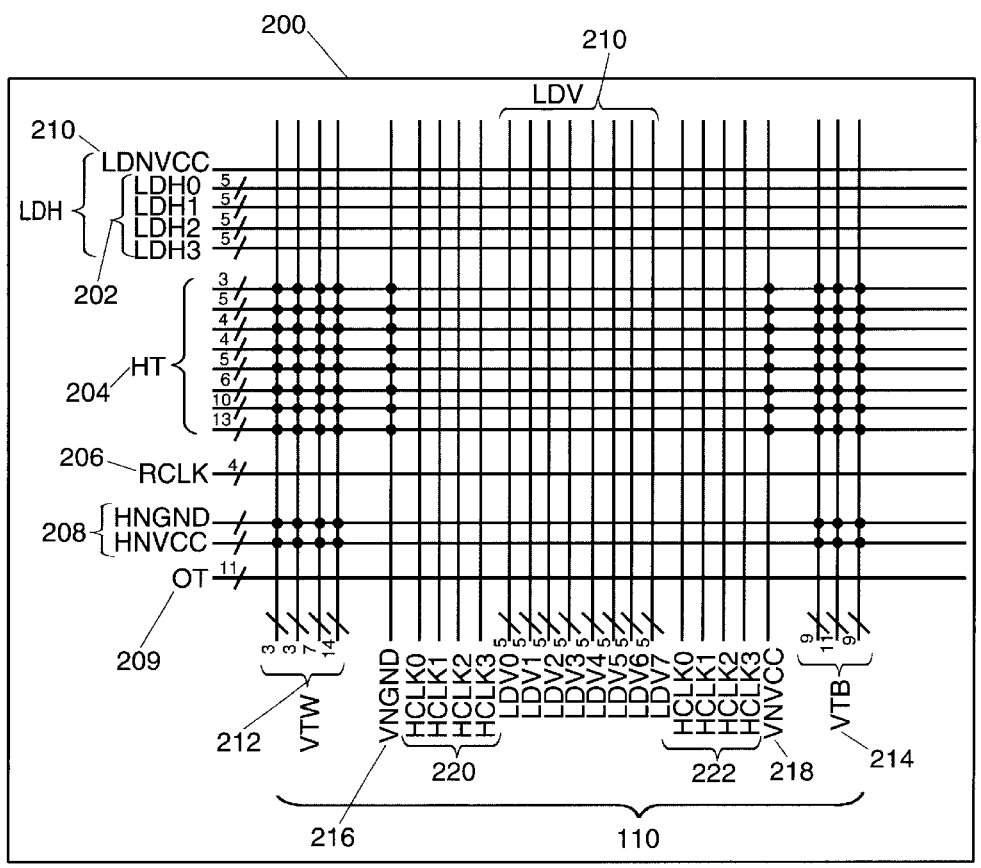
FIG. 6 is a simplified schematic diagram of the multi-level routing architecture of the present system through a logic cluster of FIG. 3.

FIG. 6 is a simplified schematic diagram of the multi-level routing architecture 200 of the present system through a logic cluster 110 of FIG. 3. Multi-level routing architecture 200 has multiple levels of routing architecture running over each row and column of logic clusters 110. In this illustrative example, there are two levels of routing architecture. In the horizontal routing channel through logic cluster 110, there are eight first-level horizontal channels 204 spanning each logic cluster 110. Individual first-level horizontal channels in first-level horizontal channels 204 have a varying number of tracks. In addition, there is an output routing channel 209, a set of horizontal tracks 208 coupled to ground and Vcc respectively, and a routed clock channel 206. The routed clock tracks 206 may drive the clock, preset and enable (not shown) pins of flip-flop 118 in logic cluster 110 as shown in FIG. 5.

Four second-level channels 202 cover each row of logic clusters 110 spanning the entire width of FPGA core 100 (as shown in FIG. 3). Each second-level routing channel 202 has five tracks. The second-level horizontal channels 202 contain a track coupled to Vcc for tie-offs of unused buffer inputs (discussed in greater detail below).

Figure 1:
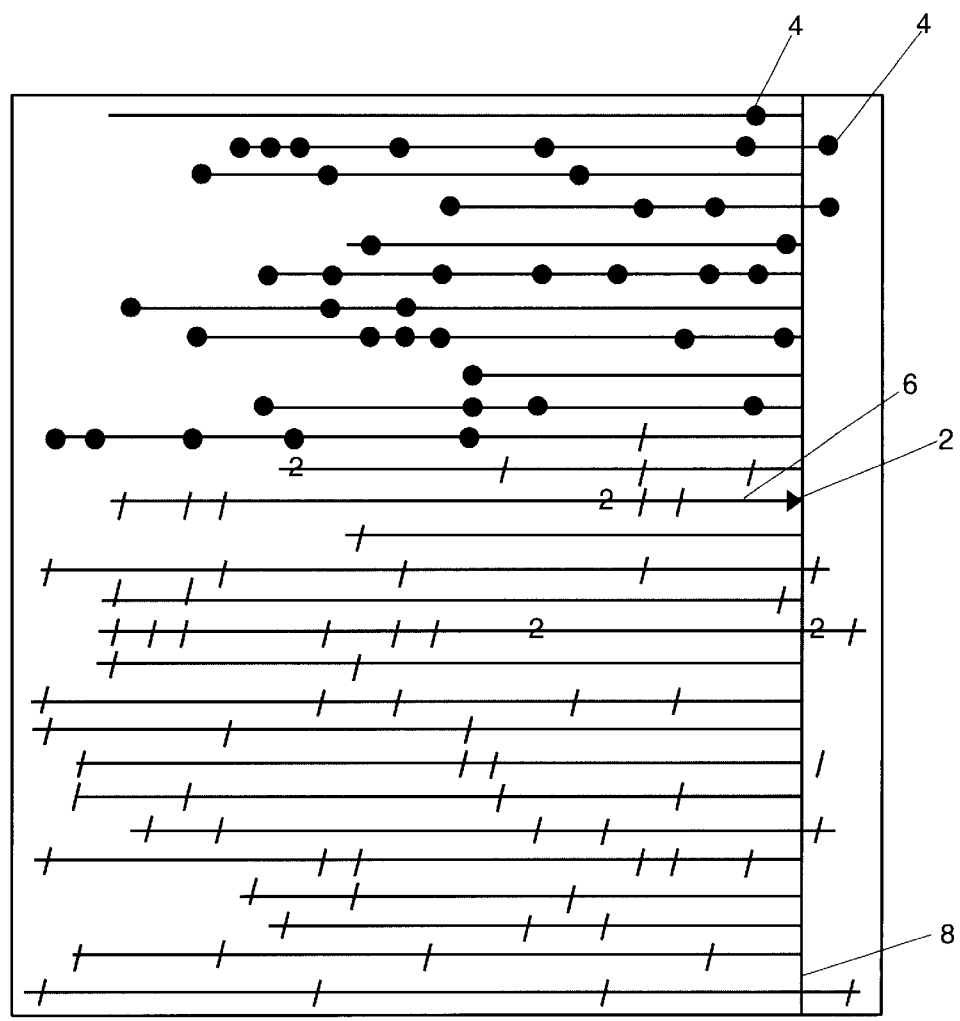
FIG. 1 is a simplified drawing showing the connectivity between a source module 2 and several destination modules 4 in an FPGA core tile.

In the vertical routing channel through logic cluster 110, there are two first-level horizontal channels, divided into a left, first-level vertical channel 212 and a right, first-level vertical channel 214, spanning each logic cluster 110. Left, first-level vertical channel 212 comprises four sets of tracks each having a varying number of tracks. Right, first-level vertical channel 214 comprises three sets of tracks each having a varying number of tracks. In addition, there is a set of vertical track 216 coupled to ground and vertical track 218 coupled to Vcc, and two hard-wired clock channels 220 and 222 respectively. The hard-wired clock tracks 220 and 222 are coupled to the clock pins in every flip-flop 126 in each logic cluster 110 as shown in FIG. 3. Eight second-level vertical channels 210 cover each column of logic clusters 110 spanning the entire width of FPGA core 100 (as shown in FIG. 1). Each second-level vertical routing channel 210 has five tracks.

Figure 7:
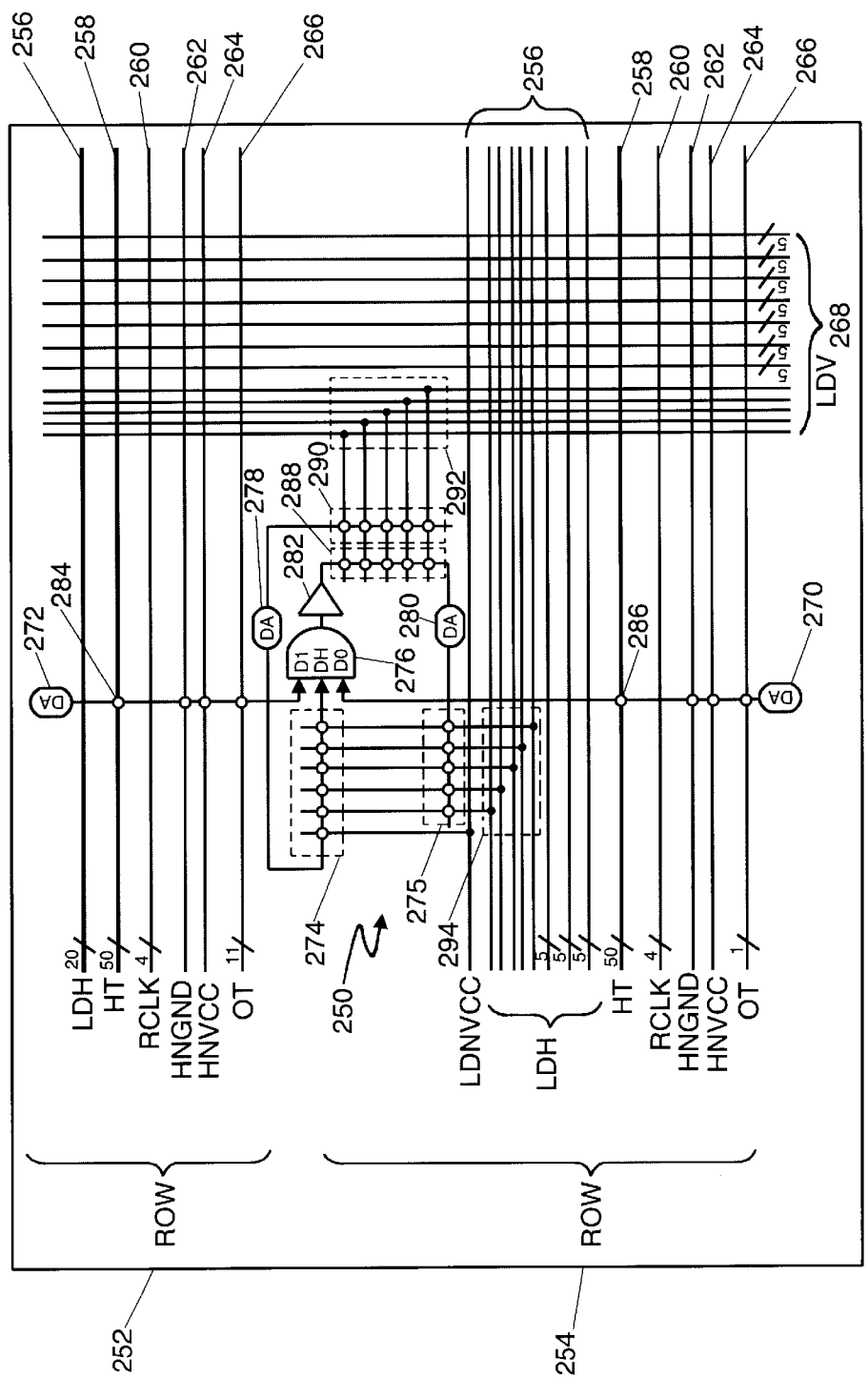
FIG. 7 is a simplified schematic diagram of a transmitter module (TX) as shown in FIG. 5.

FIG. 7 is a simplified schematic diagram of a transmitter module (TX) as shown in FIG. 5. Transmitter module 250 provides transmission capability to second-level horizontal channels 256 and second-level vertical channels 268. Transmitter module 250 comprises a three-input AND gate 276. One input of three-input AND gate 276 is coupled to first-level horizontal channel 258 in the same row 254 as transmitter module 250 and another input of three-input AND gate is coupled to first-level horizontal channel 258 in the row 252 above transmitter module 250. Therefore, transmitter module 250 may receive a signal from first-level horizontal channel 258 in the same row as transmitter module 250 or from the row above by programming one of either programmable elements 284 or 286. The third input of three-input AND gate 276 may be coupled to either second-level horizontal channel 256 in row 254 or second-level vertical channel 268. Three-input AND gate has an output coupled to an input of buffer 282. Buffer 282 has an output coupled to either second-level vertical channel through programmable element 288 or to second-level horizontal channel in row 254 through programmable element 275. As those of ordinary skill in the art having the benefit of this disclosure will recognize, direct address devices 270, 272, 278 and 280 are employed to program the respective programmable elements.

As stated above, transmitter module 250 may receive a signal from first-level horizontal channel 258 in the same row as transmitter module 250 or from the row above by programming either programmable elements 284 or 286. In one illustrative example, if programmable element 284 is programmed to receive a signal from first-level horizontal channel 258, programmable element 286 is left unprogrammed and is coupled to Vcc through track 264 in row 254. The signal is received through a first input of three-input AND gate 276. The second and third inputs of three-input AND gate 276 are tied to Vcc. The signal received from horizontal channel 258 in row 252 is then passed through buffer 282 and either routed to a second-level vertical channel 268 through programmable elements 288 and 290 or to a second-level horizontal channel 256 in row 254 through programmable elements 288 and 275. Thus, transmitter module 250 is programmably couplable to second-level vertical tracks 268 at intersection 292 through programmable elements 290 and programmably couplable to second-level horizontal tracks at intersection 294 through programmable elements 274 and 275. As one of ordinary skill in the art having the benefit of this disclosure will recognize, not all programmable elements in groups 288, 290, 275 and 294 will be programmed at once. This example is illustrative only, the actual circuit programmed through the programmable elements will depend on the user circuit mapped into the FPGA core.

Transmitter module 250 may also transfer a signal from second-level vertical channel 268 to second-level horizontal channel 256 in the same row 254 as transmitter module 250 and vice versa. For example, if a signal travels from second-level vertical channel 268 to second-level horizontal channel 256, one of programmable elements 290 is programmed and one of programmable elements 274 is programmed and fed through a second input of three-input AND gate 276. The other two inputs of three-input AND gate are tied to either Vcc via track 264. The signal from second-level vertical channel travels through three-input AND gate 276 through buffer 282 and is transferred to second-level horizontal channel through programmable element 275.

Figure 8:
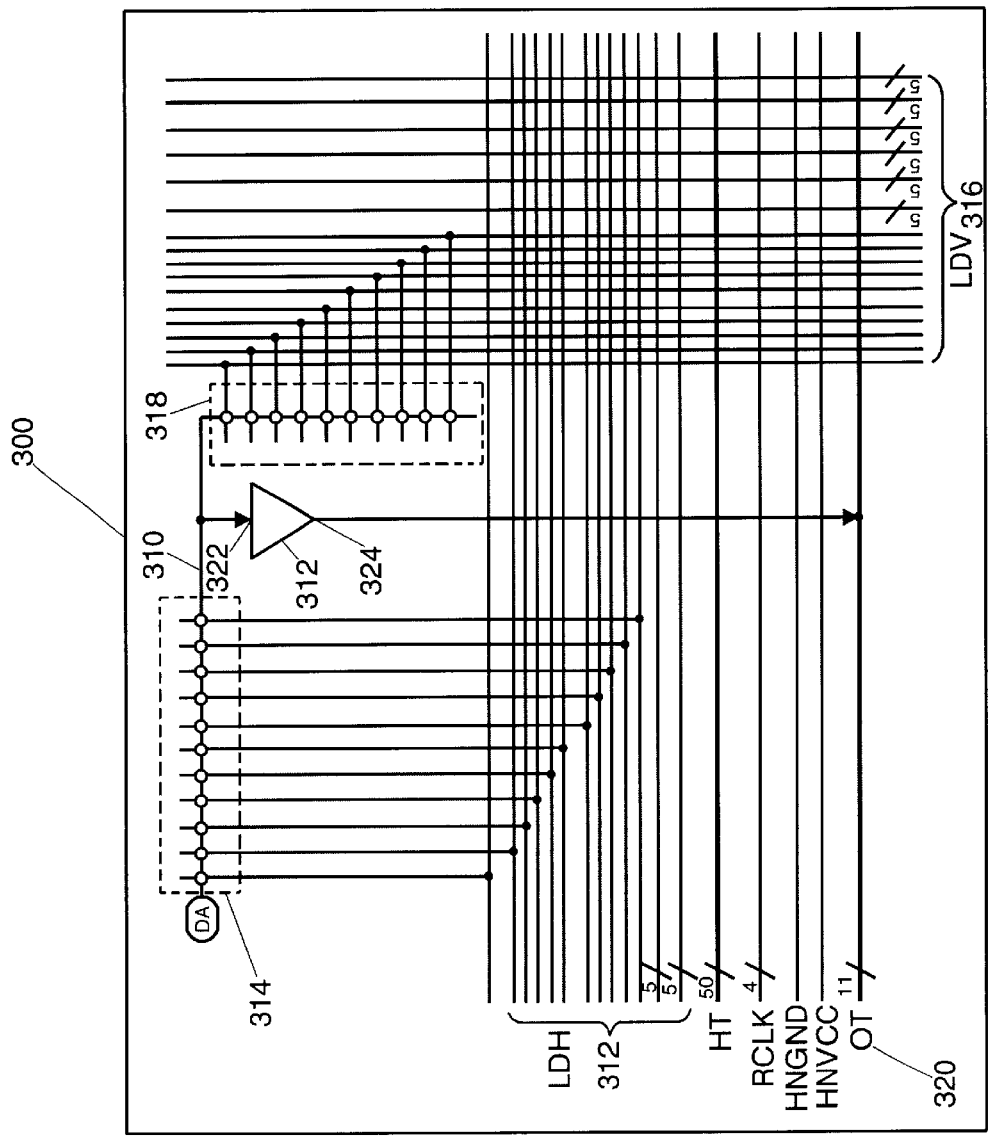
FIG. 8 is a simplified schematic diagram of the interconnect architecture of a receiver module (RX) as shown in FIG. 5.

FIG. 8 is a simplified schematic diagram of the interconnect architecture 300 of a receiver module (RX) 310 as shown in FIG. 5. Receiver module 310 comprises a buffer 312. Buffer 312 has an input 322 coupled to one of either second-level horizontal channel 312 through programmable elements 314 in the same row as RX 310 or second-level vertical channel 316 through programmable elements 318 in same logic cluster column RX 410. Buffer 312 has an output 324 coupled to its own output track 320. Output track 320 is coupled to the first-level routing architecture. Therefore, RX module 310 receives a signal from the second level routing architecture and transfers the signal back into the first-level routing architecture. As one of ordinary skill in the art having the benefit of this disclosure will recognize, not all programmable elements in groups 314 and 318 will be programmed at once. This example is illustrative only, the actual circuit programmed through the programmable elements will depend on the user circuit mapped into the FPGA core.

As is clearly illustrated in FIG. 8, the coupling between receiver module 310 and one channel (a set of five tracks) in each second-level vertical channel 316 and second-level horizontal channel 312 is shown. The representation shown is illustrative of all connections between all eight second-level vertical channels 316 and all four second-level horizontal channels 312.

Figure 9:
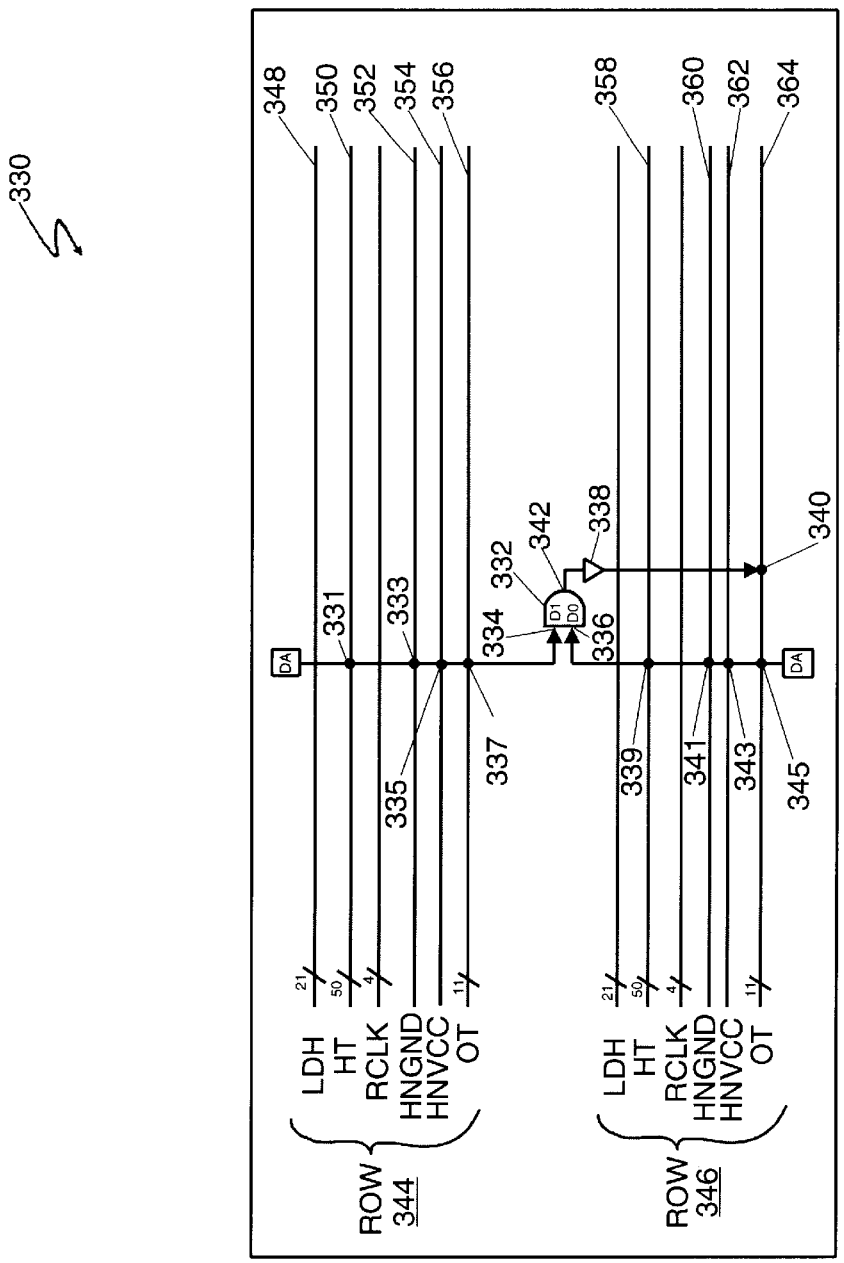
FIG. 9 is a schematic diagram illustrating a buffer module of the present system.

FIG. 9 is a schematic diagram illustrating load-capacitance-management buffer module 330 and load-capacitance-management buffer module 330 interconnects of a system according to an embodiment of the present invention. In one illustrative embodiment, load-capacitance-management buffer module 330 comprises a two input NAND gate 332. NAND gate 332 has inputs 334 and 336 and output 342. NAND gate 332 allows connection to either row 344 above load-capacitance-management buffer module 330 through programmable element 331 or in the same row 346 as load-capacitance-management buffer module 330 through programmable element 339. If input 334 of NAND gate 332 is used for an active signal to couple load-capacitance-management buffer module 330 to row 344 through programmable element 331, then input 336 of NAND gate 332 is tied to $V_{CC}$ through programmable element 343. $V_{CC}$ is an external power supply, which supplies the operating voltage for the FPGA tile. If input 336 of NAND gate 332 is used for an active signal to couple load-capacitance-management buffer module 330 to row 346 through programmable element 339, then input 334 of NAND gate 332 is tied to $V_{CC}$ through programmable element 335.

Referring still to FIG. 9, input signals from row 344 above load-capacitance-management buffer module 330 may be from a horizontal track 350 through programmable element 331, ground 352 through programmable element 333, Vcc 154 through programmable element 335 or from an output track 356 through programmable element 337. Input signals from row 346 below load-capacitance-management buffer module 330 may be from a horizontal track 358, ground 360, Vcc 162 or from an output track 364 through programmable element 337. However, output 342 is coupled to an output track 364 in row 346 below load-capacitance-management buffer module 330 through inverter 338. As a result, load-capacitance-management buffer module 330 receives a signal from row 346 through programmable element 339 or row 344 above load-capacitance-management buffer module 330 through programmable element 331 and drives its own output track 364 through line 340. As those skilled in the art having the benefit of the disclosure will know, the circuit configuration set forth above is an example only and many other configurations are obtainable.

Figure 10:
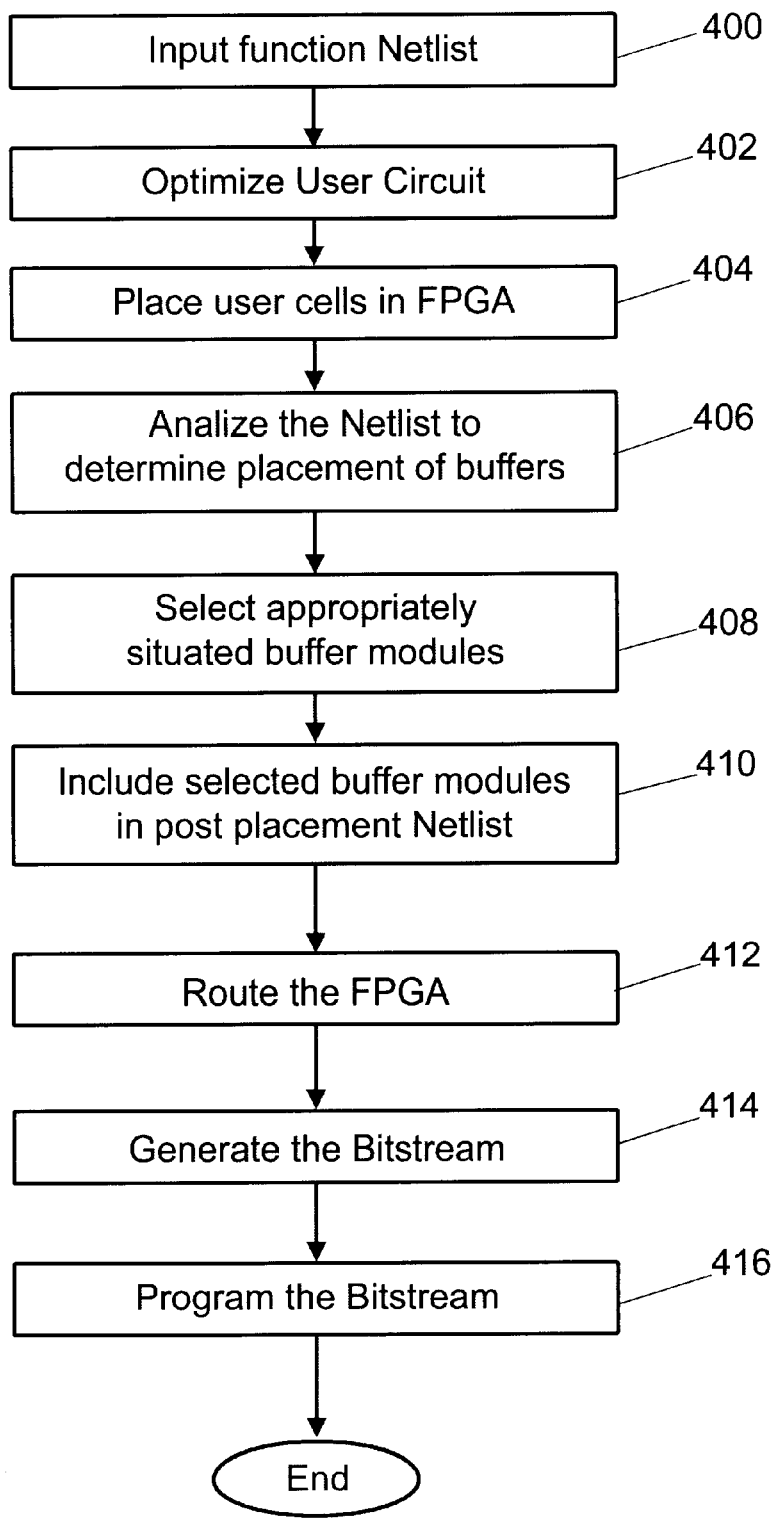
FIG. 10 is a flowchart illustrating a method of choosing appropriately situated buffer modules located in the logic clusters and including the buffer modules in the post placement netlist.

FIG. 10 is a flowchart illustrating a method of choosing appropriately situated load-capacitance-management buffer modules located in the logic clusters and including the load-capacitance-management buffer modules in the post-placement netlist. Once included in the user's post placement netlist, the load-capacitance-management buffers become part of the user circuit. The method shown in FIG. 10 may be implemented in software. Thus, a software module, which may be stored on a computer hard drive, on a floppy disk or on a CD ROM, performs the method disclosed.

At reference numeral 400, the software module inputs a function netlist defining a user circuit into the FPGA circuit. Next, at reference numeral 402, the software module optimizes the user circuit by determining the most efficient means to implement the desired circuit. At reference numeral 404, the software module places the function netlist defining the user circuit into the FPGA logic clusters. Next, at reference numeral 404, the software module examines the user netlist to determine which load-capacitance-management buffer modules 430 located within each logic cluster 110 are situated in the best location to buffer the circuit as generated from the user netlist. At reference numeral 406, the software module analyzes the function netlist to determine the placement of the load-capacitance-management buffer modules in the circuit. Each user netlist may vary. Thus, the determination of which load-capacitance-management buffer modules 430 are used to buffer each individual user circuit will vary depending on the circuit.

Next, at reference numeral 408, the software module selects the appropriately located load-capacitance-management buffer modules. At reference numeral 410, the software module includes the selected load-capacitancemanagement buffer modules into the post-placement netlist. At reference numeral 412, the software module routes the FPGA circuit. At reference numeral 414, the software module generates the data file. Finally, at reference numeral 416, the software module programs the FPGA.

While embodiments and applications of this system have been shown and described, it would be apparent to those skilled in the art that many more modifications than mentioned above are possible without departing from the inventive concepts herein. The system, therefore, is not to be restricted except in the spirit of the appended claims.

What is claimed is:

1. A field programmable gate array having a plurality of logic clusters coupled through a multilevel routing structure having at least a first level and a second level by programmable elements, said logic clusters comprising:

a plurality of logic modules at least one flip flop;

a receiver configured to transfer signals from said second level to said first level of said multilevel routing structure;

a transmitter configured to transfer signals within said second level of said multilevel routing structure and configured to transfer a signal from said first level to said second level of said multilevel routing structure; and a load-capacitance-management buffer configured to drive signals within said first level of said multilevel routing structure, wherein said load-capacitance-management buffer is programmably coupled to said first level of said multilevel routing structure via at least one programmable element.

2. The logic cluster of claim 1 wherein said at least one load-capacitance-management buffer module comprises a two-input AND gate.

3. A field programmable gate array comprising:

a plurality of interconnect conductors;

a plurality of programmable elements;

a plurality of input/output modules;

a plurality of logic clusters, said logic clusters comprising a plurality of logic modules, a plurality of receiver modules, a plurality of transmitter modules, a plurality of flip-flops and at least one load-capacitance-management buffer; and a multi-level routing structure that couples together said logic clusters through plurality of interconnect conductors and said plurality of programmable elements to said plurality of input/output modules.

4. The field programmable gate array of claim 3 wherein the plurality of programmable elements comprise antifuses.

5. The field programmable gate array of claim 3 wherein the buffer module comprises a two-input AND gate.

6. A method of constructing a field programmable gate array having a plurality of logic clusters coupled through a multilevel routing structure having at least a first level and a second level by programmable elements, said logic clusters comprising:

providing a plurality of logic modules providing at least one flip flop;

providing a receiver configured to transfer signals from said second level to said first level of said multilevel routing structure;

providing a transmitter configured to transfer signals within said second level of said multilevel routing structure and configured to transfer a signal from said first level to said second level of said multilevel routing structure; and providing a load-capacitance-management buffer configured to drive signals within said first level of said multilevel routing structure, wherein said load-capacitance-management buffer is programmably coupled to said first level of said multilevel routing structure via a programmable element.

7. The logic cluster of claim 6 wherein said at least one load-capacitance-management buffer module comprises a two-input NAND gate.

8. A method of placing buffers into an FPGA circuit comprised of a plurality of logic clusters, each of said logic clusters having buffer modules, comprising:

inputting a function netlist defining a user circuit;

optimizing said user circuit;

placing the function netlist defining the user circuit into said logic clusters;

analyzing said function netlist to determine selection of said buffer modules in said user circuit;

selecting at least one of said buffers for a post-placement function netlist;

including said at least one of said buffers in said post-placement netlist;

defining a routing structure to interconnect said logic clusters to implement said user circuit;

generating a programming data file; and programming said logic clusters with said programming data file.

9. The method of claim 8 wherein said load-capacitance-management buffer modules further comprise a two-input AND gate.

10. An apparatus for inserting load-capacitance-management buffers into a post-placement user function netlist in an FPGA circuit comprised of a plurality of logic clusters, each of said logic clusters having buffer modules, comprising:

means for inputting a function netlist defining a user circuit;

means for optimizing said user circuit;

means for placing user cells into said FPGA logic clusters;

means for analyzing said function netlist to determines selection of said load-capacitance-management buffer modules;

means for selecting at least one of said load-capacitance-management buffers for a post-placement function netlist;

means for including said at least one of said load-capacitance-management buffers in said post-placement netlist;

means for defining a routing structure to interconnect said logic clusters to implement said user circuit;

means for generating a programming data file; and means for programming said logic clusters with said programming data file.

11. The apparatus of claim 10 wherein said load-capacitance-management buffer modules further comprise a two-input AND gate.

12. A program storage device readable by a machine, tangibly embodying a program of instructions executable by the machine to perform a method for inserting load-capacitance-management buffers into a post-placement user function netlist in an FPGA circuit comprised of a plurality of logic clusters, each of said logic clusters having buffer modules, said method comprising:

inputting a function netlist defining a user circuit;

optimizing said user circuit;

placing the function netlist defining the user circuit into said logic clusters;

analyzing said function netlist to determine selection of said load-capacitance-management buffer modules in said user circuit;

selecting at least one of said load-capacitance-management buffers for a post-placement function netlist;

including said at least one of said load-capacitance-management buffers in said post-placement netlist;

defining a routing structure to interconnect said logic clusters to implement said user circuit;

generating a programming data file; and programming said logic clusters with said programming data file.

* * * * *